(12) United States Patent
Kittler, Jr.

(10) Patent No.: US 6,376,018 B1
(45) Date of Patent: Apr. 23, 2002

(54) METHOD FOR THE PRODUCTION OF UNSUPPORTED THIN FILM PARTICLES

(76) Inventor: Wilfred C. Kittler, Jr., 371 Candlelight Dr., Santa Rosa, CA (US) 95403

( * ) Notice: Subject to any disclaimer, the term of this patent is extended or adjusted under 35 U.S.C. 154(b) by 0 days.

(21) Appl. No.: 09/098,845

(22) Filed: Jun. 17, 1998

(51) Int. Cl.[7] ................................................ B05D 3/00
(52) U.S. Cl. ...................... 427/294; 427/356; 427/357; 427/404; 427/407.1; 427/416
(58) Field of Search ................................. 427/356, 357, 427/404, 407.1, 416, 294; 204/192.1

(56) References Cited

U.S. PATENT DOCUMENTS

| | | | |
|---|---|---|---|
| 3,751,288 A | * | 8/1973 | Alfrey et al. ........... 427/357 X |
| 3,947,168 A | * | 3/1976 | Ujihara et al. |
| 4,116,711 A | * | 9/1978 | Avera |
| 4,137,142 A | | 1/1979 | Vertegaal et al. |
| 4,151,059 A | | 4/1979 | Kuehnle |
| 4,309,457 A | | 1/1982 | Kawasumi et al. |
| 4,321,087 A | * | 3/1982 | Levine et al. ........... 427/357 X |
| 4,366,227 A | * | 12/1982 | Berger et al. |
| 4,661,229 A | | 4/1987 | Hemming et al. |
| 4,798,741 A | | 1/1989 | Nelson |
| 5,154,810 A | | 10/1992 | Kamerling et al. |
| 5,225,057 A | | 7/1993 | Lefebvre et al. |
| 5,337,633 A | * | 8/1994 | Carperter et al. |
| 5,510,173 A | | 4/1996 | Pass et al. |
| 5,571,624 A | | 11/1996 | Phillips et al. |
| 5,593,773 A | | 1/1997 | McKay et al. |
| 5,648,118 A | | 7/1997 | Liborius |
| 5,672,410 A | | 9/1997 | Miekka et al. |
| 5,679,402 A | | 10/1997 | Lee |
| 5,693,134 A | | 12/1997 | Stephens |
| 5,700,318 A | | 12/1997 | Brand et al. |
| 5,798,014 A | * | 8/1998 | Weber |
| 6,014,488 A | * | 1/2000 | Shustack |

* cited by examiner

Primary Examiner—Bernard Pianalto
(74) Attorney, Agent, or Firm—Sheldon & Mak; Denton L. Anderson

(57) ABSTRACT

A method and an apparatus for producing unsupported thin film particles are provided. The apparatus includes: (a) a vacuum chamber; (b) a rotatable drum disposed within the vacuum chamber; (c) means within the vacuum chamber for depositing a surface coating onto the drum when the drum is rotating; (d) means for depositing at least one thin film layer onto the surface coating to provide a thin film structure disposed atop the surface coating; and (e) a knife blade disposed proximate to the surface of the drum, such that a thin film structure deposited onto the drum can be scraped away from the drum by the rotation of the drum. In the method, a surface coating, such as a wax, is applied directly to the moving surface. Thereafter, one or more thin film layers is deposited upon the surface coating. The thin film layer or layers are thereafter scraped away from the surface coating using the knife blade. Residual surface coating material is removed from the thin film flakes and is then recycled for redeposition onto the drum.

3 Claims, 1 Drawing Sheet

METHOD FOR THE PRODUCTION OF UNSUPPORTED THIN FILM PARTICLES

FIELD OF THE INVENTION

This invention relates generally to thin film deposition methods and apparatuses and, more particularly, to methods and apparatuses for the production of unsupported thin film particles.

BACKGROUND OF THE INVENTION

Unsupported thin film particles, such as metallic flakes or flakes of a multi-layer thin film composite, are in high demand for a wide variety of products. In coating products (such as paints and inks), for example, thin film particles can be used to impart unique optical, mechanical and electrical properties to the coating product. Thin film coating particles are also commonly incorporated into sheet products (such as plastic films) and into cast and molded products to give such products unique optical, mechanical or electrical properties.

Thin film coating particles are substantially two-dimensional with matching upper and lower surfaces. The thicknesses of such particles are usually less than 10 microns, most usually less than 1 micron. Depending upon the intended use of the particles, the upper and lower surfaces of the particles typically have lateral dimensions between about 5 microns and about 500 microns.

The most common typical prior art method of producing unsupported thin film particles requires that thin film layers be deposited onto a moving web. The web is thereafter soaked in a solvent solution wherein the thin film flakes are separated from the web. This prior art method of producing unsupported thin film particles, however, has not been wholly satisfactory. For one thing, the process cannot be made wholly continuous, because the movement of the web must periodically be halted so that the web can be soaked in solvent solution for some appreciable time. This markedly limits products capacity. Also, the necessity of using a web represents a considerable capital and maintenance cost. This is especially true because the web must frequently be replaced. Finally, in those embodiments where a chilled moving surface is desirable, the use of a web generally requires multiple rotating chill drums. This is because, for a given web tension, the contact force (and hence the effectively cooled contact area) between the web and each chill drum is inversely proportional to the diameter of each chill drum. The requirement of multiple chill drums, however, requires large housings. Such large housings—which must typically be operated under vacuum—necessarily results in increased capital and operating expenses.

Accordingly, there is a need for a simple, efficient and inexpensive method of producing unsupported thin film particles which avoids the above-listed problems in the prior art.

SUMMARY

The invention satisfies this need. The invention is a method for the production of unsupported thin film composite particles comprising the steps of: (a) depositing a surface coating onto a moving surface; (b) depositing at least one thin film layer onto the surface coating to provide a thin film structure disposed atop the surface coating; and (c) scraping the thin film structure from the surface coating. The invention is also a unique apparatus for carrying out this method.

The surface coating is typically a wax and the thin film is typically scraped from the surface coating by a knife blade disposed proximate to the surface of the moving surface.

In a typical embodiment, the moving surface is a rotatable metallic drum disposed within a vacuum chamber. Located about the periphery of the drum is a plurality of coating material applicators, each adapted to distribute a single coating material onto the surface of the rotating drum. Preferably, each coating material applicator is disposed in a separate subcompartment within the vacuum chamber.

After the thin film structure (now in flake form) is scraped from the surface coating, residual surface coating material is removed from the structure, typically in a solvent washing process. The surface coating material can then be recycled to the vacuum chamber for redeposition onto the rotatable drum.

DRAWINGS

These features, aspects and advantages of the present invention will become better understood with regard to the following description, appended claims and accompanying figures where:

DETAILED DESCRIPTION

Figure 1:
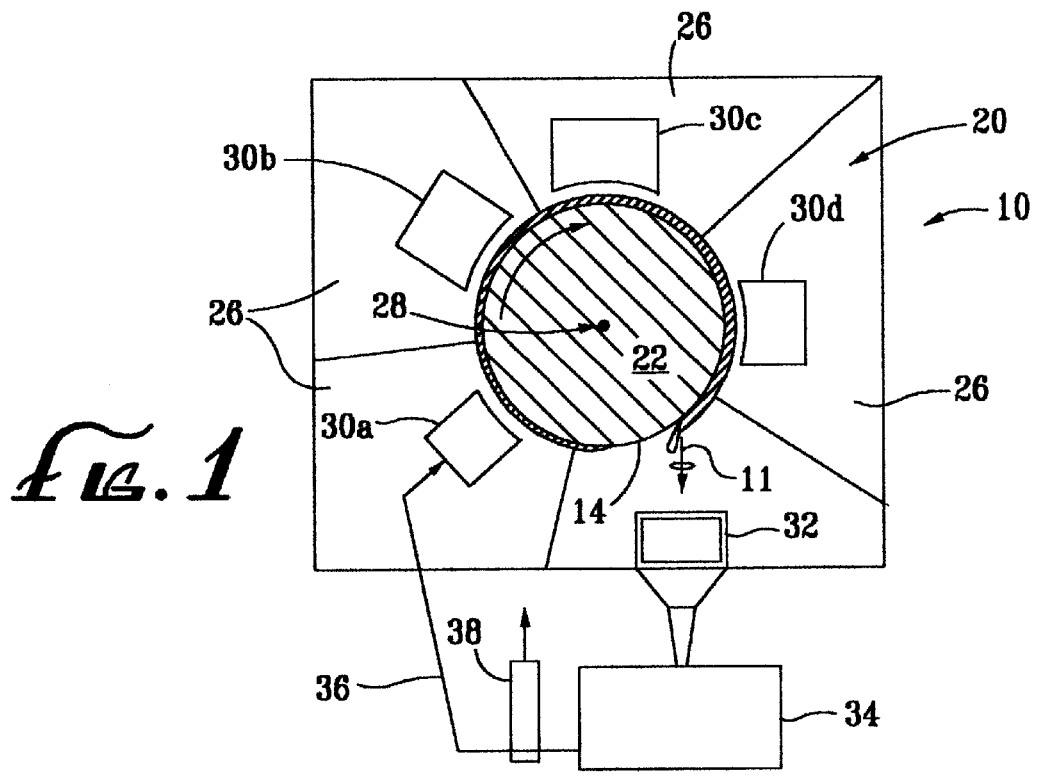
FIG. 1 is a cross-sectional side view of an apparatus useful in the invention.

The following discussion describes in detail one embodiment of the invention and several variations of that embodiment. This discussion should not be construed, however, as limiting the invention to those particular embodiments. Practitioners skilled in the art will recognize numerous other embodiments as well.

The invention is a method and an apparatus 10 for the production of unsupported thin film particles 11. The method comprises the steps of: (a) depositing a surface coating 12 onto a moving surface 14; (b) depositing one or more layers 16 onto the surface coating 12 to provide a thin film structure 18 disposed on top of the surface coating 12; and (c) scraping the thin film structure 18 from the surface coating 12.

In a preferred embodiment, the surface coating 12 consists of a highly refined wax. The surface coating 12 is preferably solid at temperatures that can be easily obtained by inexpensive cooling means, such as by water cooling and simple refrigeration equipment. The surface coating 12 should have a relatively high enough melting point so that the surface coating 12 does not melt during the deposition of thin film layers 16 onto the surface coating 12 or onto subsequent thin film layers 16 disposed atop the surface coating 12. The surface coating 12 should be chemically inert for the conditions inherent in the process. Specifically, the surface coating 12 should not polymerize under conditions existing within the vacuum chamber 20 (described below) and should not react with any of the thin film layers 16 deposited upon the surface coating 12. Also, the surface coating 12 should be readily melted at modest temperatures so that it can be readily separated from the thin film flakes 11. Preferably, the surface material is soluble in a convenient solvent that does not adversely affect the thin film particles 11.

A preferred surface material 12 is made from an olefinic material, such as highly refined waxes. Preferably, the wax has an initial melting point which is about 20° F. greater than its final melting point. The term "wax" as used herein is meant to include paraffin waxes, microcrystalline waxes, polyethylene waxes and other similar materials having similar properties in the method. Specific materials which have been found useful in the invention are refined paraffin waxes designated ROBWAX 2600, ROBWAX 2521, ROBWAX 2421, ROBWAX 2351 and ROBWAX 2271, all sold by C. J. Robertson Co., Inc., of Haverford, Pa.

In addition to waxes, other materials having suitable properties of inertness, solubility and ease of applicability can be used. For example, low molecular weight polyolefin polymers, such as polyethylene or polypropylene, may be useful in the invention.

The thin film structures 18 can consist of a single thin film layer 16, for example, thin metallic films. In other embodiments, the thin film structures 18 can be a composite of a plurality of thin film layers 16. The optical, electrical and mechanical properties of such a thin film composite can be easily varied by varying the compositions and thicknesses of the several layers.

As illustrated in the drawings, the method can be carried out in an apparatus comprising: (a) a vacuum chamber 20; (b) a rotatable drum 22 disposed within the vacuum chamber 20; (c) means within the vacuum chamber for depositing a surface coating 12 onto the surface 14 of the drum 22 when the drum 22 is rotating; (d) means for depositing at least one thin film layer 16 onto the surface coating 12 to provide a thin film structure 18 disposed atop the surface coating 12; and (e) a knife blade 24 disposed proximate to the surface 14 of the drum 22 for scraping the thin film structure, 18 off of the surface coating 12.

The vacuum chamber 20 should be capable of maintaining a low-pressure environment suitable for the deposition of thin film coatings. For plasma enhanced CVD deposition methods, the vacuum chamber 20 should be capable of maintaining a pressure between about 1 and about 1000 millitor; for sputtering processes, between about 0.1 and about 100 millitor; and for evaporation processes, between about 0.001 millitor anh 10 millitor.

As illustrated in FIG. 1, the vacuum chamber 20 may comprise a plurality of subchambers 26. Preferably, each subchamber 26 is separately controllable with respect to pressure, gas flow rates and gas flow compositions.

The rotatable drum 22 is typically circular, having a central axis 28 which is substantially equidistant from all points on the surface 14 of the drum 22. The surface 14 of the rotatable drum 22 can be smooth or it can have a roughened or textured surface which can aid in adhesion and surface heat transfer. Unlike in the prior art moving web process, there are no heat transfer limitations with respect to the diameter of the drum 22. Because the surface coating 12 and the thin film structure 18 are coated directly onto the drum 22 (as opposed to being applied to a moving web disposed over the drum), the cooling of the thin film 18 by heat transfer between the thin film structure 18 and the drum 22 is not a problem with large diameter drums 22. Preferably, the drum 22 is made from a metal or other material having a high coefficient of thermoconductivity.

Preferably, the revolving drum 22 can be temperature controlled to maintain a surface temperature below a predetermined maximum surface temperature. This allows the user to control the surface temperature of the drum 22 to temperatures sufficiently low to promptly harden the surface coating 12 and to prevent the surface coating 12 from melting during the application of the thin film structure 18. For typical waxes, the moving surface is preferably controllable to a temperature between about −30° C. and 100° C.

Disposed within each subchamber 26 is a separate coating material applicator 30, adapted for the deposition of a layer of a material onto the rotatable drum 22. Each such subchamber 26 can be separately controlled with respect to pressure and gaseous environment by operation of optional vacuum pumps, process gas supplies, etc. associated with each individual subchamber 26.

The surface coating 12 is applied to the moving surface 14 by any of a variety of deposition techniques known in the art, such as by extrusion or by evaporation.

In a preferred embodiment, the surface coating 12 is evaporated from a container and conveyed via heated passages to a linear orifice located adjacent to the chilled rotating drum 22. Thereafter, it is condensed directly onto the surface 14 of the drum 22 as the drum 22 rotates. Preferably, the surface temperature of the drug 22 is chosen such that the solidification of the condensed surface coating 12 occurs very quickly. Excellent control over the applied thickness of the surface coating 12 can be obtained by varying the temperature of the evaporation pool and vessel, thereby changing the evaporation rate. The thickness of the surface coating 12 can also be varied by varying the exposure time of the drum 22 to the vapor stream, for example, by increasing or decreasing the rotation rate of the drum 22.

It is also possible to coat the surface 14 of the drum 22 by direct application of liquid surface coating 12 to the surface 14 of the drum 22—similar to the coating of waxes onto paper—by extruding liquid surface support material through heated metering dies onto the surface 14 of the drum 22. Variations of this "slot die coating" technique are well-known in the coating industry.

In all cases, the surface coating 12 must generally be thoroughly heated in a vacuum prior to its application to the drum surface 14, so as to remove dissolved gases which could otherwise outgas or cause spattering or coating defects. Heating the surface coating material 12 under vacuum can be effectively accomplished in a separate container and the degassed surface coating material 22 thereafter piped through heated tubes to an evaporation vessel. A series of appropriate valves can be used to maintain the vessel under vacuum under the transfer process. The fluid surface coating can conveniently be used as a sealing medium to preserve vacuum integrity.

Preferably, the surface coating applicator 30a has additional valves to provide the operator with the option of starting and stopping the coating process during operation.

Because surface coating materials 12, such as suitable waxes, can be melted at temperatures between about 90° F. and about 300° F., non-exotic materials of construction, such as copper and inexpensive stainless steels, can be used in construction of the apparatus 10.

Figure 2:
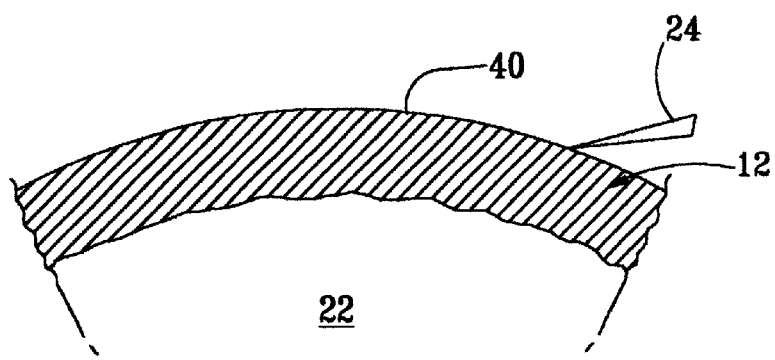
FIG. 2 is a detail view of the surface of a rotatable drum useful in the invention.

As illustrated in FIG. 2, the use of the surface coating 12 provides the significant advantage that out of-round conditions in the drum surface 14 or drum surface imperfections or intentional texturing is automatically compensated for prior to the application of the thin film layer 16. This is accomplished by applying the initial precoat layer of surface coating 12 to the rotating drum 22 until the thickness of the surface coating 12 builds up to where it is continuously contacted by the knife blade 24. As the fully built-up layer of surface coating 12 passes under the knife blade 24, the knife blade 24 automatically sculpts the outermost surface of the surface coating 12 to a smooth and perfectly rounded shape. This feature dramatically reduces capital costs and maintenance which would otherwise be associated with having to build and maintain a perfectly round and smooth drum surface.

The coating material applicators 30b useable for depositing each of the thin film layers onto the moving surface 14 include the many deposition devices known in the prior art. These include heated evaporators, sources which utilize electron beam heating for evaporation ("e-beam sources"), various elements of sputtering sources known as DC diodesuttering, DC triode sputtering, AC or high frequency sputtering, dual magnetron sputtering, RF sputtering, etc., cathodic arc sources, anodic arc sources, chemical vapor deposition and other suitable means for forming thin films by the condensation and/or reaction of materials on the surface to be coated. Such sources may be equipped with shutters, valves or other control means for alternatively starting and stopping the deposition process.

The knife blade 24 is disposed proximate to the surface 14 of the rotatable drum 22, such that thin films 16 deposited upon the drum 22 are scraped away by the knife blade 24 as the drum 22 rotates the surface 14 of the drum 22 in the direction of the knife blade 24.

The knife blade 24 is typically similar to skiving knife blades used in the production of wood veneers. The knife blade 24 is typically smooth with a sharp, non-serrated edge.

The knife blade 24 can optionally be heated to facilitate the slicing of the surface coating 12.

Also, the knife blade 24 may comprise a plurality of blades or other mechanical separators nominally oriented in the plane perpendicular to the central axis 28 of the rotatable drum 22. This provides the user with the ability to longitudinally segregate non-uniform areas of the thin film structure 18 (at the edges of the rotating drum 22) from the more uniform central portion of the thin film structure 18.

Figure 3:
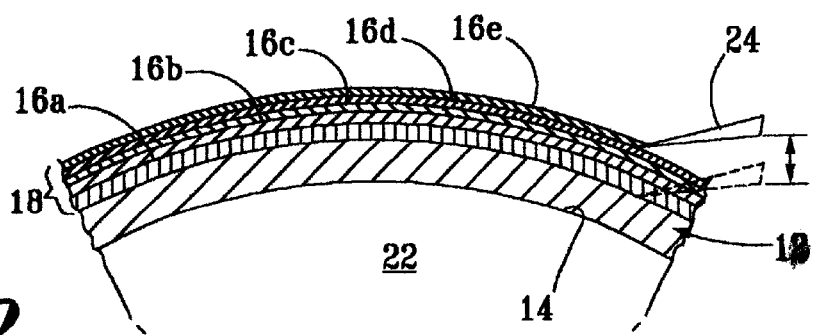
FIG. 3 is a second detail view of a rotatable drum useful in the invention.

The knife blade 24 can be disposed at a fixed location. In an alternative embodiment illustrated in FIG. 3, the knife blade 24 is made adjustable so as to be moved from a first knife blade position wherein the knife blade 24 is more proximal to the rotatable drum 22, and a second knife blade position wherein the knife blade 24 is less proximal to the surface of the rotatable drum 22.

Typically, the apparatus 10 further comprises a vacuum lock 32 which allows the removal of the thin film flakes 11 from the vacuum chamber 20 without disturbing the vacuum environment within the vacuum chamber 20.

Although in many uses of the resulting thin flake products 11, the inclusion of a small amount of residual surface coating 12 is not detrimental, many uses require the removal of all excess surface coating 12 from the thin flake products 11. Thus, the apparatus 10 can further comprise surface coating separation means 34 for removing the surface coating 12 from the finished thin film flakes 11 and for recycling the surface coating 12 for redeposition onto the rotatable drum 22. Such separation means 34 will typically include equipment for contacting the thin film flakes 11 with a solvent capable of dissolving excess surface coating 12. Where the surface coating 12 is a wax, such solvents can be organic solvents, such as kerosene and heptane. Preferably, however, the solvent is supercritical carbon dioxide. Use of supercritical carbon dioxide is convenient, effective and protective of the environment. Supercritical carbon dioxide dissolves the surface coating 12, thereby removing the surface coating 12 from the thin film flakes 11. Thereafter, the removed surface coating 12 can be precipitated by reducing the pressure of the carbon dioxide. The dissolving "power" of the supercritical carbon dioxide can be conveniently varied by varying its temperature and (especially) its pressure.

After the surface coating 12 is removed from the thin film flakes 11, the surface coating 12 can then be recycled back to the vacuum chamber for redeposition onto the rotatable drum (via line 36 in FIG. 1). Where the surface coating 12 is a wax, it is usually desirable to first remove any light ends or other gaseous materials from the surface coating 12 prior to its recycle to the rotatable drum 22. Such degassing can be accomplished with appropriate degassing equipment 38 known in the art.

In operation, a vacuum is drawn on the vacuum chamber 20, including in each of the operating subchambers 30. The rotatable drum 22 is chilled to a sufficiently low temperature to promptly harden surface coating material 12 applied to the surface 14 of the drum 22. Rotation of the drum 22 is then initiated and the surface coating application equipment 30a is activated. The surface coating applicator 30a applies a coating of surface material 12 to the rotatable drum 22 while the drum 22 is rotating. The thickness of the surface coating 12 is allowed to build up by successive rotations of the rotatable drum 22 until the upper surface 40 of the surface coating 12 continuously contacts the knife blade 24. In this way, the knife blade 24 provides a continuous smooth outer surface 40 to the hardened surface coating 12.

The thin film applicator 30b or applicators (30a and 30b in FIG. 1) are then activated to apply a thin film structure 18 onto the hardened outer surface 40 of the surface coating 12. Where the thin film structure 18 is a composite of several layers. 16, a first thin film applicator 30b is activated to provide a first thin film layer 16a directly to the outer surface 30 of the surface coating 12. As the drum 22 rotates past the second thin film applicator 30b, a second thin film layer 16b is disposed directly atop the first thin film layer 16a by a third thin film applicator 30c. Successive thin film layers 16c can be applied by successive thin film applicators 30d. All of the thin film applicators 30 are disposed about the exterior of the rotatable drum 22. Accordingly, a completed, multi-layer thin film structure 18 can be applied to the surface coating 12 by a single rotation of the drum 22.

As the thin film layer passes the knife blade 24, the knife blade 24 scrapes away the thin film structure 18 from the surface coating 16. Because the thickness of the surface coating 16 was initially built up to the height of the knife blade 24, during production operation, that which is scraped away by the knife blade 24 is essentially only the thin film structure 18 (plus a minimal thickness of surface coating 12). Because the knife blade 24 is never in contact with the surface 14 of the rotatable drum 22 itself, there is no wear and tear on either the drum 22 or on the knife blade 24. This feature dramatically minimizes maintenance costs.

The thin film structure 18 which is scraped away from the surface coating 16 by the knife blade 24 is transported to the vacuum lock 32, such as by gravity, where it can be removed from the vacuum chamber 20 without affecting the vacuum conditions within the vacuum chamber 20. The thin flakes 11 are then conveyed to solvent wash apparatus 34 where they can be contacted with a suitable solvent, such as supercritical carbon dioxide. Thereafter, the thoroughly cleaned thin film flakes 11 are conveyed to suitable storage, and the residual surface coating material 12 removed by the solvent from the thin film flakes 11 is first degassed in the degassing equipment 38 and then recycled to the surface material applicator 30a within the vacuum chamber 20.

In a variation on this operation, apparatus 10 having a knife blade 24 which is movable can be used to produce thin film flakes 11 of greater thicknesses. The knife blade 24 is movable between a first position, wherein the knife blade 24 is more proximal to the surface of the rotatable drum 22 and a second position, wherein the knife blade 24 is less proximal to the surface of the rotatable drum 22. The knife blade 24 is first moved to the first knife blade position and the surface coating 12 is applied by successive rotations of the rotatable drum 22 (as described above) until the thickness of the surface coating 12 continuously contacts the knife blade 12. Thereafter, the knife blade 24 is retracted to the second knife blade position, and the surface coating material applicator 30a is inactivated. A thick thin film structure 18 is then built up on the outer surface 30 of the surface coating 12 by successive revolutions of the rotatable drum 22. When the thin film structure 18 reaches sufficient thickness, the knife blade 24 is again moved to the first knife blade position, whereupon the rotation of the rotatable drum 22 automatically scrapes the thin film structure 18 from the surface material 12. Residual surface coating material 12 can be removed from the produced thin film flakes 11 in the same manner described above and the residual surface coating material 12 can be recycled back to the surface coating material applicator 30a.

Having thus described the invention, it should be apparent that numerous structural modifications and adaptations may be resorted to without departing from the scope and fair meaning of the instant invention as set forth hereinabove and as described hereinbelow by the claims.

What is claimed is:

1. A method for the production of unsupported thin film composite particles comprising the steps of:
   (a) within a vacuum chamber, depositing a surface coating onto a rotating drum, the rotating drum being temperature controllable to temperatures below a preselected maximum temperature;
   (b) depositing a first thin film layer onto the surface coating;
   (c) depositing a second thin film layer onto the first thin film layer to form a thin film composite;
   (d) scraping the thin film composite from the surface coating;
   (e) within a vacuum chamber, depositing additional surface coating onto the rotatable drum; and
   (f) continuously repeating steps (b)–(e).

2. The method of claim 1 wherein the vacuum chamber comprises a plurality of discrete subchambers wherein within subchamber a different material is deposited onto the rotating drum.

3. The method of claim 1 wherein the surface coating is a wax.

* * * * *